(12) United States Patent
Pourrahimi

(10) Patent No.: US 11,009,572 B2
(45) Date of Patent: May 18, 2021

(54) INTEGRATED SINGLE-SOURCED COOLING OF SUPERCONDUCTING MAGNETS AND RF COILS IN NUCLEAR MAGNETIC RESONANCE DEVICES

(71) Applicant: Shahin Pourrahimi, Brookline, MA (US)

(72) Inventor: Shahin Pourrahimi, Brookline, MA (US)

( * ) Notice: Subject to any disclaimer, the term of this patent is extended or adjusted under 35 U.S.C. 154(b) by 0 days.

(21) Appl. No.: 16/140,466

(22) Filed: Sep. 24, 2018

(65) Prior Publication Data

US 2020/0096581 A1  Mar. 26, 2020

(51) Int. Cl.
*G01R 33/34* (2006.01)
*G01R 33/38* (2006.01)
*G01R 33/3815* (2006.01)

(52) U.S. Cl.
CPC ..... *G01R 33/3403* (2013.01); *G01R 33/3804* (2013.01); *G01R 33/3815* (2013.01)

(58) Field of Classification Search
CPC ............ G01R 33/3403; G01R 33/3815; G01R 33/3804
See application file for complete search history.

(56) References Cited

U.S. PATENT DOCUMENTS

| | | | | |
|---|---|---|---|---|
| 5,247,256 A | * | 9/1993 | Marek | G01R 33/31 324/315 |
| 2005/0262851 A1 | * | 12/2005 | Atrey | F25D 19/00 62/6 |
| 2012/0108433 A1 | * | 5/2012 | Jiang | G01R 33/3815 505/163 |

* cited by examiner

*Primary Examiner* — Akm Zakaria
(74) *Attorney, Agent, or Firm* — Arjomand Law Group, PLLC

(57) ABSTRACT

A method and a system are disclosed for obtaining imaging data using a MRI system configured to provide accurate images with high Signal-to-Noise Ratio (SNR) using superconducting magnets with field strengths in the range of 0.5 Tesla (T) to 3 T. The MRI includes a scanning bore deployed within a Cryogen-Free (CF) conduction-cooled superconducting magnet. The CF may have two stages, in which one stage cools a radiation shield down to a mid-level temperature, such as 35-80 degrees Kelvin (K), and the second stage cools the cold-mass further down to about 3-6 degrees K. The two-stage CF cryocoolor is used to cool target bodies of the superconducting magnet system and the receiving RF coil to create a higher SNR relative to when RF coils are not cooled. Sapphire sheets or bars may be used to cool the RF coils because sapphire conducts heat but not electricity, reducing electrical noise.

20 Claims, 3 Drawing Sheets

INTEGRATED SINGLE-SOURCED COOLING OF SUPERCONDUCTING MAGNETS AND RF COILS IN NUCLEAR MAGNETIC RESONANCE DEVICES

TECHNICAL FIELD

This application relates generally to devices that are based on Nuclear Magnetic Resonance (NMR). More specifically, this application relates to a method and apparatus for cooling superconducting magnets and Radio Frequency (RF) coils with a single integrated cooling system in an NMR device.

BRIEF DESCRIPTION OF THE DRAWINGS

The drawings, when considered in connection with the following description, are presented for the purpose of facilitating an understanding of the subject matter sought to be protected.

DETAILED DESCRIPTION

Figure 1:
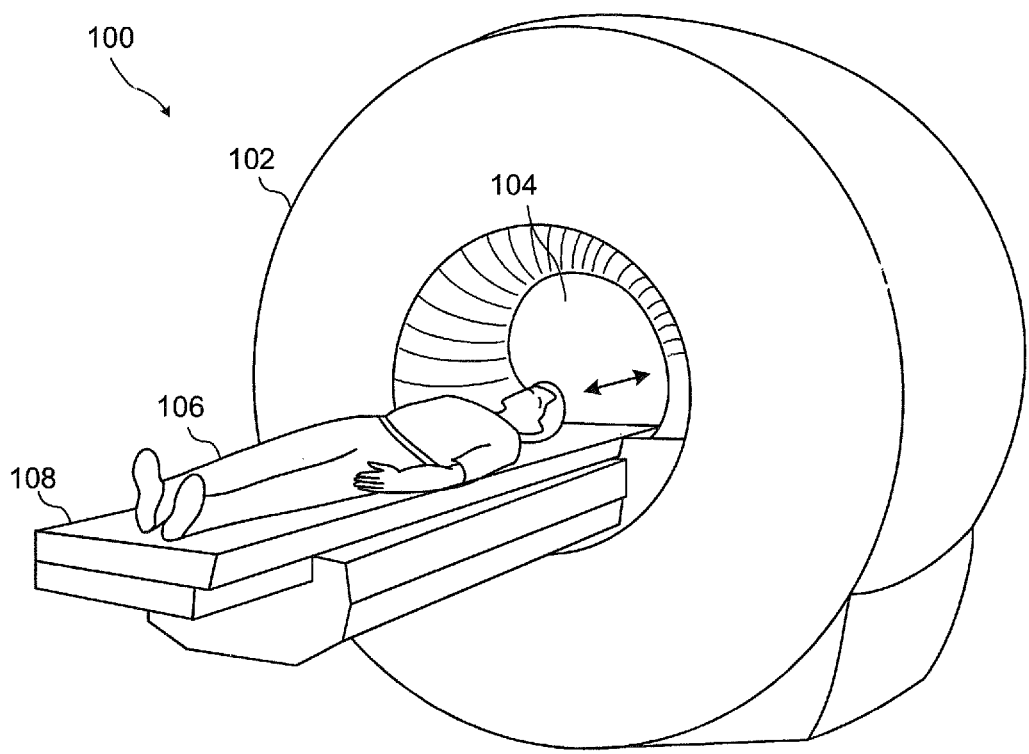
FIG. 1 shows an example arrangement for using a conventional whole-body or head Magnetic Resonance Imaging (MRI) system for medical diagnostics.

While the present disclosure is described with reference to several illustrative embodiments described herein, it should be clear that the present disclosure should not be limited to such embodiments. Therefore, the description of the embodiments provided herein is illustrative of the present disclosure and should not limit the scope of the disclosure as claimed. The present disclosure relates to devices that operate based on Nuclear magnetic resonance (NMR) phenomenon. Magnetic Resonance Imaging scanner is a specific example of an NMR device, and another example is an NMR spectrometer.

NMR is a physical phenomenon in which nuclei in a magnetic field absorb and re-emit electromagnetic radiation (signal). The signal is a function of specific resonance frequency which depends on the strength of the magnetic field and the magnetic properties of the isotope of specific atoms. NMR phenomenon is at the core of MRI scanners and NMR spectrometers. To increase NMR signal in NMR devices subjects are placed in background fields of power magnets generating fields of 0.5 to 20 T, or even higher. Radiofrequency coils (RF coils) are used as transmitters, receivers, and sometimes also as transceivers, of radiofrequency (RF) signals in NMR devices.

High resolution MRI scanners and NMR spectrometer use superconducting magnets to facilitate the generation of strong signal, and specially designed RF coils to generate strong RF signal. In the following operations of MRI scanners are used as examples to describe method of improving their performance. The methods described in this disclosure apply equally to both MRI scanners and NMR spectrometers.

Nuclear Magnetic Resonance (NMR) is a physical phenomenon in which nuclei in a magnetic field absorb and re-emit electromagnetic radiation. This energy is at a specific resonance frequency which depends on the strength of the magnetic field and the magnetic properties of the isotope of the atoms; in practical applications, the frequency is similar to VHF and UHF television broadcasts (60-1000 MHz). NMR allows the observation of specific quantum mechanical magnetic properties of the atomic nucleus. Many scientific techniques exploit NMR phenomena to study molecular physics, crystals, and non-crystalline materials through NMR spectroscopy. NMR is also routinely used in advanced medical imaging techniques, such as in magnetic resonance imaging (MRI).

Radiofrequency coils (RF coils) are the transmitters, receivers, and sometimes as dual purpose transmit-and-receives, of radiofrequency (RF) signals in the magnetic resonance imaging (MRI). The MR signal in MRI is produced by the process of resonance, which is the result of radiofrequency coils. They consist of two electromagnetic coils, the transmitter and receiver coils generating and receiving electromagnetic fields. Atomic nuclei of interest in MRI studies have their own resonant frequencies, in the radiofrequency portion of the electromagnetic spectrum.

Briefly described, a method and a system are disclosed for obtaining imaging data from human head and brain using a Head-scanning MRI (HMRI) system configured to provide highly accurate images with high Signal-to-Noise Ratio (SNR or S/N) using superconducting magnets of moderate field strengths primarily in the range of 0.5 Tesla (T) to 1.5 T, but also applicable, to various extents, to other field strengths outside this range. In some embodiments, the HMRI may include a scanning bore deployed within an actively or passively shielded, Cryogen-Free (CF), conduction-cooled superconducting magnet. In some embodiments, the CF magnet uses a two stage cryocooler, in which a first stage cools a certain part of the magnet system (target first-stage body to be cooled, like the radiation shield of the superconducting magnet) down to a mid-level temperature range, such as 30-85 degrees Kelvin (K), and the second stage cools certain other parts of the superconducting magnet (target second-stage body to be cooled like the cold mass of the superconducting magnet) further down to lower temperature range, for example, about 3-20 degrees K, near absolute zero temperature.

This is so that the system components that need to operate in the superconducting state, such as the superconducting coils in the cold mass, are safely below their respective superconducting critical temperatures. In various embodiments, either one of the two-stage CF magnet system is used to cool both the target body and the receiving RF coil to create a higher SNR relative to when RF coils are not cooled. In some embodiments, cooling substrates made from sapphire are used to cool the RF coils by conduction because sapphire conducts heat efficiently but not electricity, hence it cools but does not increase or contribute to generation of electromagnetic noise. In some embodiments, a vacuum vessel of the CF magnet, in which the superconducting magnet is deployed, is configured to have a patient bore as well as an annulus to allow fitting of gradient coil. In some embodiments the vacuum vessel wall separating the patient bore and the vacuum space is made from a material that is electrically non-conducting so that the said wall doesn't contribute to generation of electromagnetic noise.

MRI is a technique for accurate and high-resolution visualization of interior of animal tissues among other applications. This technique is based on the Nuclear Magnetic Resonance (NMR) property. MRI is often implemented in the form of a scanning device or scanner in which the patient lies horizontally or is positioned within a scanning bore (see FIG. 1) of sufficient size to accommodate the whole body or parts of the body of the patient, such as limbs or head. The main components of an MRI scanning system include a scanning bore surrounded by various devices including a primary field magnet, usually a superconducting electromagnet, including several superconducting coils, generating a powerful static and stable magnetic field that surrounds the patient positioned within the scanning bore. The static magnetic field aligns atomic nuclei in the patient's tissues in the direction of the magnetic field. The MRI system further includes one or two sets of Radio Frequency (RF) coils for transmitting, receiving, or both, a set of magnetic gradient coils, an active or passive magnetic shield, and various mechanical and thermal insulation components that enable the superconducting magnet to have structural integrity and remain cold. Other mechanical, electrical and software components are used in conjunction with the above components to create a working MRI system.

In simplified operation, when soft tissue is placed in the static magnetic field generated by the primary magnet, the hydrogen (H) atoms contained in the soft tissue align in the direction of the static magnetic field, along the axis of the scanning bore of the MRI. At this point, an RF pulse which is frequency-tuned to the static magnetic field is generated by the RF transmit coil to create resonance in the H atoms. The alignment directions (or state) of the H molecules are changed by the RF pulse. When the RF pulse ends, the alignment of H atoms reverts to its original state while at the same time emitting signals. The RF receive coil picks up the emitted signals and sends to a computer for conversion to an image using mathematical calculations such as Fourier Transform.

An assemblage of magnetic gradient coil, which usually includes three sets (one set for each dimension of space), collectively often called gradient coil, are used to encode the magnetic field in the bore of the magnet so that RF signals emitted from H atoms can be referenced to where the atoms are located within the bore of the magnet.

The MRI image is subsequently constructed with computer software based on the known and detected changes in the magnetic field and RF signal, allowing for spatial information needed to construct an image to be recovered from the measured signals using various mathematical techniques, such as Fourier analysis. By using gradient fields in different directions, two Dimensional (2D) images or 3D volumes can be obtained in any arbitrary orientation.

More specifically, MRI in part uses the fact that body tissue contains a large proportion of water, and hence protons (Hydrogen nuclei), the orientation of which are aligned in a particular direction when placed within a large static magnetic field. Each water molecule has two hydrogen nuclei or protons. The average magnetic moment of many protons becomes aligned with the direction of the field. RF transmitter coils are used to produce a momentary RF varying electromagnetic field with a resonance frequency, which changes or flips the spin of the protons. After the RF coils are turned off, the varying magnetic field disappears causing the spins of the protons to return to their original states and be re-aligned with the static magnetic field. This return to original spin state is called relaxation. During this relaxation, an RF signal is generated by the change in the spin, which can be detected by instruments such as receiver RF coils. Thus, 3D information about the origin of the signal in the body may be obtained by applying additional gradient magnetic fields. These known additional gradient magnetic fields may be applied to specify the location from which RF signal is received.

Protons in different tissues return to their original equilibrium state within the static magnetic field at different relaxation rates. Different tissue variables, including spin density, various relaxation times, and flow and spectral shifts, can be used to construct images. By changing the settings on the scanner, contrast may be created between different types of body tissue. MRI may provide better contrast between the different soft tissues of the body, such as the organs, the brain, muscles, the heart, malignant tissues, and other soft tissues compared with other imaging techniques such as Computer Tomography (CT) or X-rays. MRI is also generally safer because unlike CT scan or X-ray, no ionizing radiation is used in MRI, and thus, it is safer from a radiation standpoint. As such, MRI scanners are often used for biomedical research and diagnosis of human disease and disorder.

Imaging by an MRI scanner requires a very uniform, constant, and stable magnetic field over a specific volume. Conventionally, such a magnetic field, often referred to as a $B_0$ field, is produced by a permanent or a superconducting magnet. For human applications, MRI devices that use permanent magnets typically generate a $B_0$ magnetic field of less than one Tesla (T). For higher resolution imaging, superconducting electromagnets producing higher magnetic fields are used. Typically, high resolution human MRI scanners use magnets that generate fields of 0.5 T or higher. Often superconducting MRI magnets that generate a field of higher than 0.5 T have a cylindrical bore for equipment and patient access (patient bore). Open MRI machines (which do not have a tubular bore that is closed on all sides except its two ends, to contain the patient or body parts) can also achieve 0.5 T and even 1 T, but become proportionally large, heavy, and expensive to buy, install, and operate. If the patient bore is large enough to allow for the whole human body to fit through the scanner, it is referred to as a whole body scanner. Such scanners are large and expensive. There are certain other smaller scanners that have smaller bores, allowing the extremities, head, arms and legs, to fit through. These scanners, referred to as head-scanners and extremities scanners, are smaller and less expensive but offer acceptable scanning over the head, or arms and legs. The magnetic fields of superconducting magnets with cylindrical bores are typically generated by a number of solenoid type superconducting coils within the overall superconducting magnet.

Superconducting $B_0$ magnets use coils that need to be maintained at cryogenic temperatures that are lower than the critical temperature of the superconducting coils to allow superconductor mode of the coil material to appear, in which electrical resistance is zero. To achieve this, conventionally, the coils of a superconducting MRI magnet operate in a pool of liquid helium, at close to atmospheric pressure that keeps the coils at about 4.2 K.

An alternative to operating MRI superconducting coils in a pool of liquid helium is to cool the coils by a cryocooler that is physically and thermally connected to the coils by solid materials that conduct heat away from the coils. Conventionally, these types of magnets are called cryogen-free (CF) or conduction-cooled magnets.

One of the customary methods of achieving a substantially constant magnetic field is to operate the superconducting magnet of an MRI system in a "Persistent Mode," in which mode the current circulates, almost perpetually, without applying further power, through a substantially zero-resistance closed-loop set of coils. The advantage of the persistent mode is the constancy of the magnetic field, which is better than what can be achieved in a normal, driven, or non-persistent mode of operation (in which mode power is applied to maintain the current), even with the best regulated power supplies. Furthermore, in the persistent mode no additional energy is needed to power the windings and, therefore, the power supply can be turned off.

For safety reasons, MRI scanners are used and operated within an area where the magnetic field outside of the area is less than 5 Gauss. The area inside of the 5 Gauss line is sometimes called the MRI magnet's 5-Gauss footprint. For reasons of efficiency and installation cost, superconducting magnets used in MRI applications are magnetically shielded to minimize the 5-Gauss footprint. MRI superconducting magnets may be shielded actively or passively. In an actively shielded MRI superconducting electromagnet operating in persistent mode, all field coils and shielding coils, as well as the persistent mode switch coil, are connected in series by superconducting electrical joints. The shield coils, however, are connected to the rest of coils such that the sense of the currents (direction of current flow) in the shielding coils are opposite those of the other coils.

The quality and resolution of MRI-generated image depends on a number of factors. One factor is a strong, uniform, and stable primary field generated by the primary superconducting magnet. Generally, the stronger the field the higher the SNR and the better the resolution and quality of the resulting image. For example, increasing the strength of the primary magnetic field from 0.5 T to 1.5 T improves SNR. Further increase in the primary magnetic field for example, up to 3 T, leads to higher SNR. However, more powerful magnets are also more expensive, bigger, heavier, and face more limitations in choice of installation sites. Another factor that affects SNR is the electrical conductivity of the NMR probe, or receiver RF coil, used to detect signals generated during the relaxation process. Since the electrical conductivity of preferred RF coil materials, for example copper, improve as its temperature is reduced, if the probe, or receive RF coil, can be maintained at cryogenic temperatures, the Signal to Noise Ratio (SNR) is improved (S/N increased) compared with higher temperatures. However, the transmitter RF coil may remain at room temperature or cryogenic temperatures. But the gain in SNR is mostly associated with conductivity of the receiver RF coil. When the receiver RF coil is cooled, a smaller primary magnetic field, B0, may be used to obtain the same image quality as a more powerful primary magnet and a non-cooled RF coil. For example, cooling the probe (receiver RF coil) made from high purity copper to about 40 degrees K using a first stage of the two-stage cryocooler, may, in principle, increase electrical conductivity by a factor of about 20, which may create multiple times or significant increase in SNR.

FIG. 1 shows an example arrangement for using a Magnetic Resonance Imaging (MRI) system for medical diagnostics. Typically, a diagnostic arrangement 100 includes a whole-body MRI scanner 102 having a scanning bore 104, which is a tunnel-like opening, to accommodate the whole body of a patient 106 lying on a bed 108. The bed 108 slides into the opening 104 to position the appropriate portion of the patient's body within the MRI magnet system to start the scanning process.

Typically, the first stage of a two-stage cryocooler cold-head used in MRI CF magnets operates at about 40-60° K and can remove about 30-50 Watts (W) of heat, and the second stage operates at about 4-6° K and can remove additional about 1-2 W of heat. In some conduction-cooled systems, after the various parts of the superconducting magnet are cooled to their operating temperature, the entire cooling power of the two stages of the cryocooler cold-head is no longer needed. Hence, some of the extra cooling power of the first stage or the second stages of the same cryocooler may be used to cool the RF coil and some of its electronics.

While cooling the RF coil by, for example, the first stage of the cryocooler to 40-80 K, the conductivity of copper that typically makes up the RF receiver coil increases by a factor of about 20 when at 40K and a factor of 4 when at 80K, thereby allowing for higher signal-noise ratio and therefore high resolution for the MRI scanner. If the second stage of the cryocooler cold-head were used to cool the RF receive coil to even lower temperatures than 40 K then the conductivity of copper improves further and therefore further improvements in SNR would be achievable.

The present disclosure further teaches that conduction of heat from the RF coil and its electronics may be advantageously accomplished by heat conduction members made from sapphire, including sapphire fibers and composite members that include sapphire. Sapphire may be chosen for its high heat conductivity relative to other material while at the same time lacking electrical conductivity. The low or non-existent electrical conductivity reduces or substantially eliminates the generation of eddy current by the heat conducting members. In some embodiments, the heat conduction may be via composite materials made from Litz copper wires or cables similar to those discussed by Pourrahimi in U.S. Pat. No. 8,275,429. Litz copper wire/cable is chosen for its high heat conductivity and generation of low levels of eddy current within the heat conducting members. The elimination of eddy currents reduces electrical noise and thus increases SNR.

Figure 2:
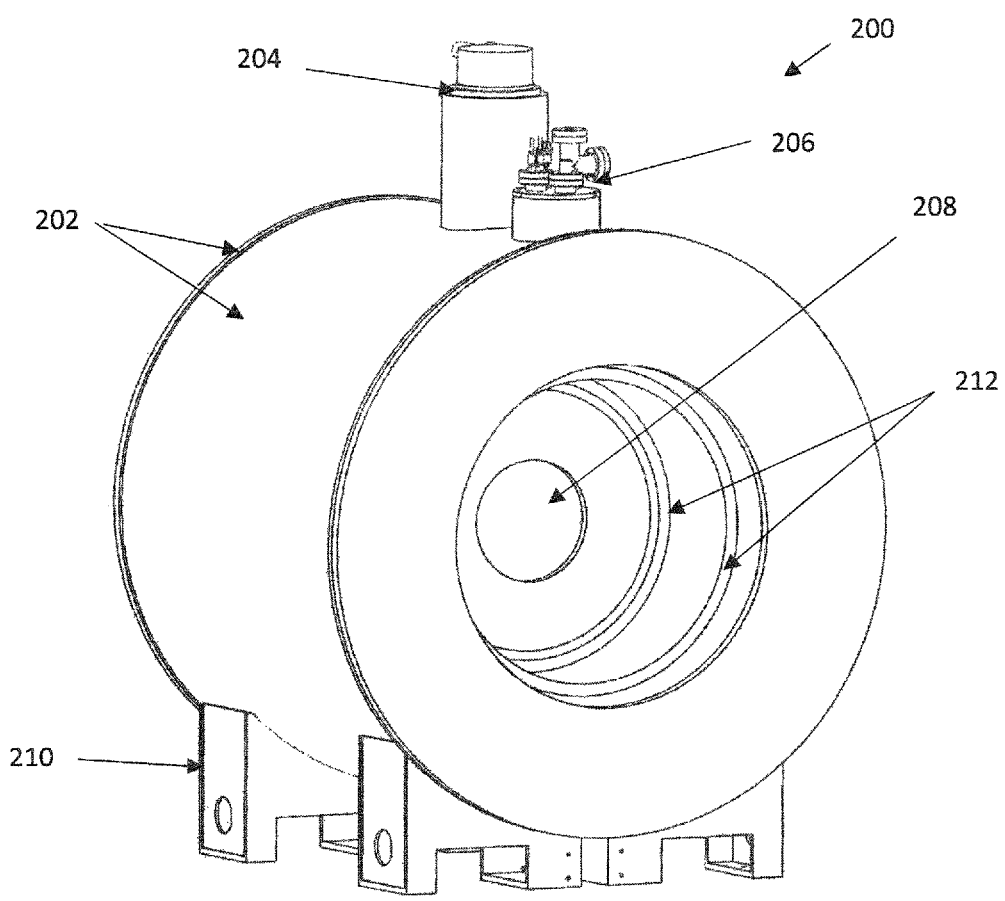
FIG. 2 shows an example configuration of an MRI system for medical diagnostics having an integral cooling system for cooling both the superconducting magnets and RF coils.

FIG. 2 shows an example configuration of an HMRI system for medical diagnostics having an integral cooling system for cooling both the superconducting magnet and RF coils. In various embodiments, MRI magnet system 200 includes body enclosure or vacuum vessel 202 (cryostat), cooling port with cryocooler cold-head 204, instrument and vacuum port 206, scanning bore 208, support structure 210, and asymmetric gradient coil 212 fitted inside an annulus designed as part of the exterior of the vacuum vessel 202.

In various embodiments, the cryocooler cold-head 204 is a two-stage cryocooler cold-head connected to the first stage body and second stage body within the enclosure 202 to conduct heat away from the overall superconducting magnet. Radiation shield (part of the target first stage body) and vacuum created inside the enclosure 202 substantially reduce heat transfer between the cold-mass and the external environment in which the MRI system is placed. Hence, the only mode of heat transfer is conduction via cold-head 204.

Figure 3:
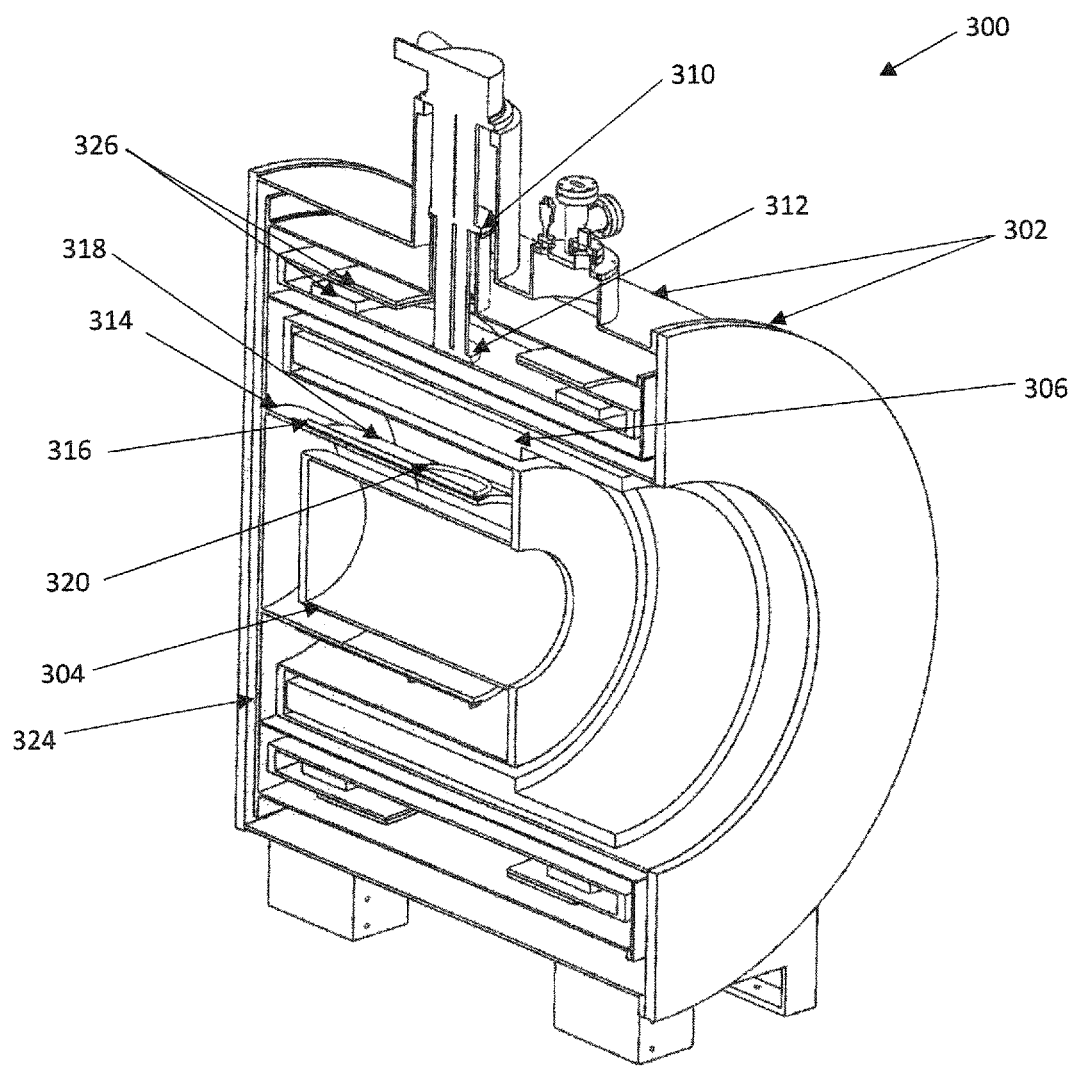
FIG. 3 shows a perspective cross-section of the example MRI system of FIG. 2.

FIG. 3 shows a perspective cross-section of the example HMRI system of FIG. 2. In various embodiments, MRI magnet system cross-section 300 shows external enclosure or vacuum vessel 302 (cryostat), non-conducting magnet cryostat bore 304, gradient coil 306, first stage of cryocooler 310, second stage of cryocooler 312, heat-conducting tubular member 314, sapphire heat exchanger 316 bonded to non-conducting tubular member 318 and extended over and bonded to tubular member 314, receiver RF coils 320, inner layer and radiation shield 324 of cryostat 302, and superconducting coils 326 that is a part of the cold mass 328.

FIG. 3 shows an example of HMRI with a closed end bore. Those skilled in the art realize that the present disclosure applies to open bore HMRI as well.

As described above, to generate higher-resolution, clearer, and higher-quality MRI images, a number of elements are needed. These elements include a strong, uniform, and stable primary field, RF transmitter coils, magnetic gradient coil, and cooled RF receiver coils. In some embodiments, the same RF coil may be used as both a transmitter RF coil and a receiver RF coil. Cooling both the first stage body, which includes the optional radiation shield, and the receiver RF coils by conduction by the first stage of the cryocooler cold-head 310 allows the RF receiver coils to cool to temperature of 40-80 K, resulting in a clearer MRI image than without cooling the receiver RF coils.

In various embodiments, cryostat 302 is a vessel which is pumped to create a vacuum inside to substantially prevent convective and heat transfer through space within the cryostat. Using radiation shield 324, radiative mode of heat transfer to the cold-mass is also substantially reduced. This leaves heat conduction via solid members and electrical instrumentation wiring as the only paths for heat transfer to the radiation shield and the cold-mass.

With continued reference to FIG. 3, those skilled in the art would recognize that the thermal and physical relationships between various components are shown including the cryostat and the major, but not the only, components needed for mechanical support and cooling down the first stage body of the magnet system (radiation shield), the receiver RF coils 320, and the second stage body (cold-mass) of the CF magnet system, to their operating temperatures using the two-stage cryocooler. The configuration of the thermal and physical connections between the cryocooler cold-head and the first stage body, RF coils, and the second stage body may vary in details, but direct or indirect strategic physical thermal connections are needed to cool these components.

In one embodiment, the first stage 310 of the cryocooler cold-head is physically coupled with the radiation shield 324, and the second stage 312 of the cold-head is physically coupled with the cold-mass 328. As noted above, the first stage may cool the radiation shield down to about 40-80° K, while the second stage may further cool down the cold-mass to about 3-6° K. The first stage is also strategically coupled to the receiver RF coils 320, via the radiation shield 324, to the heat-conducting tubular member 314, further connected to non-conducting tube 318, further connected to bars or sheets of heat-conducting but not electricity-conducting material 316, such as sapphire, as shown. Sapphire, or other material with similar properties are used to remove heat from the receiver RF coils 320 and their wiring to cool them down, while at the same time substantially not conducting electricity to reduce electrical noise and increase SNR.

With this cooling configuration, in operation, heat is removed from receiver RF coils 320 by thermal conduction via sapphire bars 316 to conductive tube 314, to radiation shield 324, and eventually to the first stage cold-head 310. This way the receiver RF coil is cooled down to about 40-80° K, improving SNR. The cold-mass 328, which includes the superconducting coils 326 are cooled via the second stage 312 of the cryocooler down to 3-6 K.

The gradient coil 306 may be symmetrical or asymmetrical in design, and therefore the physical configuration. In some embodiments, the asymmetrical gradient coil, shown in FIG. 3, may have two sections, each with a different internal diameter, creating a geometric discontinuity like a step between the two sections, as shown in FIG. 3. The bigger diameter section can accommodate a patient's shoulders while the head is placed inside the scanning bore 304. In some embodiments, the MRI system may be specialized for head and brain scanning. Such an MRI system will be more compact relative to full body scanners and will be more readily available and affordable to medical clinics and research institutes.

In various embodiments, the cooling system may include a single-stage cryocooler physically coupled with both an optional radiation shield, the cold-mass, and the receiver RF coils to cool them. In other various embodiments, the cooling system may include two or more cooling stages in which all or some of the cooling stages may be physically coupled with both or one of the primary field magnet and the receiver RF coils. The common method in all these embodiments is that at least one of the stages of the same cryocooler cold-head, regardless of the number of cooling stages it may have and how such stages may be coupled with the cold-masses, cools the target body to be cooled as well as the receiver RF coils to increase SNR. This approach to increasing SNR reduces both the complexity and the cost of high resolution MRI scanners.

With such cooling configuration and physical system configuration as described herein, both the target body to be cooled, for example first stage body that is often the radiation shield, and the receiver RF coils are cooled by the first stage of the cryocooler cold-head to temperatures of 40-80 K, achieving higher SNR relative to non-cooled receiver RF coils.

In another embodiment of this invention the second stages of a cryocooler cold-head cools cold-mass of the magnet systems that included the superconducting coils to about 3-6 K, and the RF receive coils to temperatures below 40 K, achieving even higher SNR relative to non-cooled receiver RF coils.

Changes can be made to the claimed invention in light of the above Detailed Description. While the above description details certain embodiments of the invention and describes the best mode contemplated, no matter how detailed the above appears in text, the claimed invention can be practiced in many ways. Details of the system may vary considerably in its implementation details, while still being encompassed by the claimed invention disclosed herein.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the claimed invention to the specific embodiments disclosed in the specification, unless the above Detailed Description section explicitly defines such terms. Accordingly, the actual scope of the claimed invention encompasses not only the disclosed embodiments, but also all equivalent ways of practicing or implementing the claimed invention.

The above specification, examples, and data provide a complete description of the manufacture and use of the composition of the invention. Since many embodiments of the invention can be made without departing from the spirit and scope of the invention, the invention resides in the claims hereinafter appended. It is further understood that this disclosure is not limited to the disclosed embodiments but is intended to cover various arrangements included within the spirit and scope of the broadest interpretation so as to encompass all such modifications and equivalent arrangements.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While the present disclosure has been described in connection with what is considered the most practical and preferred embodiment, it is understood that this disclosure is not limited to the disclosed embodiments, but is intended to cover various arrangements included within the spirit and scope of the broadest interpretation so as to encompass all such modifications and equivalent arrangements.

What is claimed is:

1. An integrated Magnetic Resonance Imaging (MRI) magnet system with high signal-to-noise ratio (SNR) imaging capability, wherein the system comprises:
    an exterior vacuum vessel forming a vacuum space and having a patient bore and an annulus for a gradient coil;
    a first stage body enclosed within the vacuum vessel;
    a second stage body, including a superconducting magnet, enclosed within the first stage body;
    a Radio Frequency (RF) transceiver coil or an RF transmitter coil or an RF receiver coil placed within the first stage body; and
    a cryocooler, with at least a first and a second stage, mechanically coupled with parts within the vacuum vessel, wherein the first stage of the cryocooler cools the first stage body and the RF receiver coil or the RF transceiver coil or the RF transmitter coil to a temperature of $T_1$ degrees by thermal conduction through solid materials and the second stage of the cryocooler cools the second stage body to a temperature of $T_2$ degrees by thermal conduction through said solid materials, and wherein $T_1 > T_2$ and wherein the superconducting magnet and at least one RF coil, from said RF transceiver or RF transmitter or RF receiver coils, are placed in said vacuum space of said vacuum vessel and are cooled by said cryocooler.

2. The system of claim 1, wherein $T_1$ is between 30 to 85 degrees K and $T_2$ is between 3 to 20 degrees K.

3. The system of claim 1, wherein the second stage of the cryocooler further cools the RF receiver or the RF transceiver coil to a temperature below T1 degrees.

4. The system of claim 1, wherein the first stage of the cryocooler also cools the RF transmitter.

5. The system of claim 1, further including a cooling substrate for conductively cooling the RF receiver coil wherein the cooling substrate is heat-conducting but is electrically substantially non-conducting.

6. The system of claim 5, wherein the cooling substrate is sapphire or sapphire composites.

7. An integrated Magnetic Resonance Imaging (MRI) magnet system comprising:
    a vacuum vessel forming a vacuum space and having a superconducting field magnet and a Radio Frequency (RF) receiver coil deployed therein; and
    a cryocooler mechanically coupled with parts within the vacuum vessel and further thermally connected by solid materials to the superconducting field magnet and to the RF receiver coil to cool both the superconducting field magnet and the RF receiver coil by thermal conduction through said solid materials; wherein the superconducting field magnet and the RF receiver coil are placed in said vacuum space of said vacuum vessel and are cooled by said cryocooler.

8. The system of claim 7, further comprising a heat transfer member deployed between the RF receiver coil and the cryocooler, wherein the heat transfer member is heat-conducting but is electrically substantially non-conducting.

9. The system of claim 7, wherein the vacuum vessel wall separating a patient bore and a vacuum space is made from an electrically non-conducting material.

10. The system of claim 7, wherein the cryocooler is a single-stage cryocooler.

11. The system of claim 7, wherein a first stage of the cryocooler cools the RF receiver coil and a second stage of the cryocooler further cools the superconducting field magnet or the superconducting field magnet and the RF receiver coil.

12. The system of claim 7, further including a radiation shield within the vacuum vessel wherein the radiation shield encloses the superconducting field magnet and wherein the cryocooler cools the radiation shield, the RF receiver coil, and the superconducting field magnet.

13. An integrated high signal-to-noise ratio (SNR) Magnetic Resonance Imaging (MRI) magnet apparatus comprising:
    a cold-mass that includes superconducting coils;
    a radio frequency (RF) coil;
    a radiation shield surrounding the cold-mass and the RF coil;
    a vacuum vessel enclosing the radiation shield in a vacuum space; and
    a multi-stage cryocooler cold-head coupled with the vacuum vessel, wherein a first stage of the cold-head is physically thermally coupled with the radiation shield and the RF coil, and a second stage of the cold-head is physically thermally coupled with the cold-mass, and the cold-head cools the radiation shield and the RF coil to $T_1$ temperature, and cools the cold-mass to $T_2$ temperature and wherein $T_1$ is higher than $T_2$, and wherein the cryocooler provides cooling by conduction of heat through solid materials, and wherein the superconducting coils and the RF coil are placed in the said vacuum space of said vacuum vessel and are cooled by the first stage or the second stage of said cryocooler.

14. The apparatus of claim 13, further comprising a heat transfer member deployed between the RF coil and the cryocooler, wherein the heat transfer member is heat-conducting but is not electricity-conducting.

15. The apparatus of claim 13, wherein the vacuum vessel wall separating a patient bore and the vacuum space is made from an electrically non-conducting material.

16. An integrated Nuclear Magnetic Resonance (NMR) spectrometer magnet system comprising:
   a superconducting field magnet;
   a Radio Frequency (RF) coil probe;
   a vessel, having a vacuum space, enclosing the superconducting field magnet and the Radio Frequency (RF) coil probe within the vacuum space; and
   a cryocooler thermally coupled with parts within the vessel and further coupled with the superconducting field magnet and the RF coil probe, wherein the cryocooler cools both the superconducting field magnet and the RF coil probe to same or different temperatures by thermal conduction through solid materials, and wherein the superconducting field magnet and the RF coil probe are placed in said vacuum space of said vessel and are cooled by said cryocooler.

17. The NMR spectrometer magnet system of claim 16, wherein the cryocooler has a first stage and a second stage and the first stage cools a first stage body that includes the RF coil probe and the second stage cools the superconducting field magnet.

18. The NMR spectrometer magnet system of claim 17, wherein the second stage of the cryocooler also cools the RF coil probe.

19. The NMR spectrometer magnet system of claim 16, wherein cooling structure uses sapphire or sapphire composites in close vicinity of the RF coil to conduct heat from the RF coil probe to a cryocooler cold head.

20. The NMR spectrometer magnet system of claim 16, wherein the cryocooler uses materials with high thermal conductivity and substantially low electricity conductivity to conduct heat from the RF coil probe to a cooling structure.

* * * * *